United States Patent
Anderl et al.

(10) Patent No.: US 7,352,575 B2
(45) Date of Patent: Apr. 1, 2008

(54) DYNAMIC AIR MOVING SYSTEM

(75) Inventors: William J. Anderl, Rochester, MN (US); Maurice F. Holahan, Lake City, MN (US); Arvind K. Sinha, Rochester, MN (US); Gregory S. Vande Corput, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 61 days.

(21) Appl. No.: 11/461,250

(22) Filed: Jul. 31, 2006

(65) Prior Publication Data

US 2008/0024983 A1  Jan. 31, 2008

(51) Int. Cl.
*H05K 7/20* (2006.01)

(52) U.S. Cl. ............ 361/695; 361/690; 361/694; 174/16.1; 165/104.33; 165/122

(58) Field of Classification Search ........... None
See application file for complete search history.

(56) References Cited

U.S. PATENT DOCUMENTS 6,711,013 B2 * 3/2004 Wobig et al. ............ 361/687

2002/0152766 A1    10/2002  Fischer et al.
2006/0061966 A1 *  3/2006  Korinsky et al. ........... 361/695
2006/0256522 A1 * 11/2006  Wei et al. ................. 361/695

FOREIGN PATENT DOCUMENTS

JP    63226548 A  *  9/1988
JP    10093275 A  *  4/1998

* cited by examiner

*Primary Examiner*—Boris Chérvinsky
(74) *Attorney, Agent, or Firm*—Cantor Colburn LLP

(57) ABSTRACT

Disclosed is a dynamic air moving system comprising a rail system disposed in an electronic enclosure, at least one fan housing moveably disposed on the rail system, the fan being actuatable along the rail system, a pivotable fan disposed in each of the at least one fan housings, at least one blade included with the fan, the at least one blade being rotatable about at least one blade axes, a fan controller chip controlling actuation of at least one fan housing, individual rotation of at least one blade, and rotation of the fan, a chip thermal sensor disposed on at least one chip located in the electronic enclosure, the thermal sensor being linked to the fan controller chip, and a drive thermal sensor disposed on at least one disk drive associated with the electronic enclosure, the drive thermal sensor being linked to the fan controller chip.

7 Claims, 3 Drawing Sheets

DYNAMIC AIR MOVING SYSTEM

BACKGROUND OF THE INVENTION

1. Field of the Invention

The disclosure relates generally to a cooling system, and more particularly to a cooling system disposed in an electronic enclosure.

2. Description of Background

As microprocessors and other electronic components in servers grow more powerful, they consume more electrical power. Consequently, they emit more heat. While many computers have sufficient cooling capacity, inefficiencies in the airflow within electronic enclosures have led to overheating, resulting in server shutdowns. Some operators have compensated by lowering the overall computer room temperature, but this solution leads increased operating costs, and is at best a short-term fix. Another solution includes throttling the speed of the microprocessor resulting in lower performance. The projected growth in microprocessor use, along with continued use of double and quad core chips, will require more efficient use of cooling resources, especially for rack-mounted servers.

SUMMARY OF THE INVENTION

Disclosed is a dynamic air moving system comprising a rail system disposed in a cooling cavity of an electronic enclosure, the rail system being associated with an enclosure surface adjacent the cooling cavity, at least one fan housing moveably disposed on the rail system, the fan being actuatable along the rail system in an x-direction, a fan disposed in a fan cavity defined by each of the at least one fan housings, the fan being pivotable within the fan cavity about an axis running substantially orthogonally to the enclosure surface, at least one axis structure associating the fan with each of the at least one fan housing, at least one blade included with the fan, the at least one blade being rotatable about a central fan axis and individually rotatable about at least one blade axes, a fan controller chip disposed in the electronic enclosure, the fan controller chip controlling actuation of at least one fan housing, individual rotation of at least one blade, and rotation of the fan, a chip thermal sensor disposed on at least one chip located in the electronic enclosure, the thermal sensor being linked to the fan controller chip, and a drive thermal sensor disposed on at least one disk drive associated with the electronic enclosure, the drive thermal sensor being linked to the fan controller chip.

BRIEF DESCRIPTION OF THE DRAWINGS

The foregoing and other features and advantages of the present invention should be more fully understood from the following detailed description of illustrative embodiments taken in conjunction with the accompanying Figures in which like elements are numbered alike in the several Figures.

DETAILED DESCRIPTION OF THE INVENTION

Figure 1:
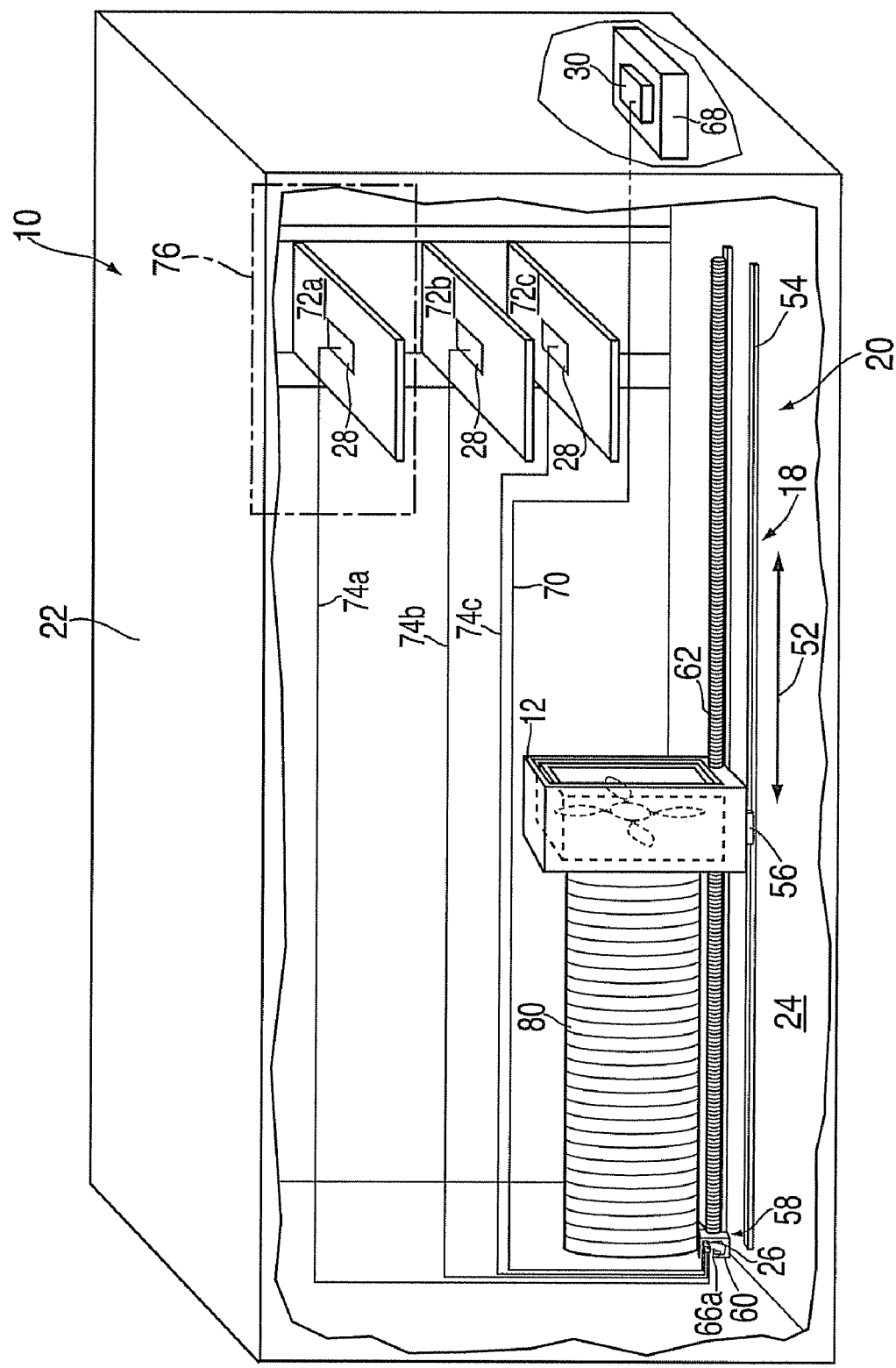
FIG. 1 is a side perspective view of a section of a schematic of a dynamic air moving system.
Figure 2:
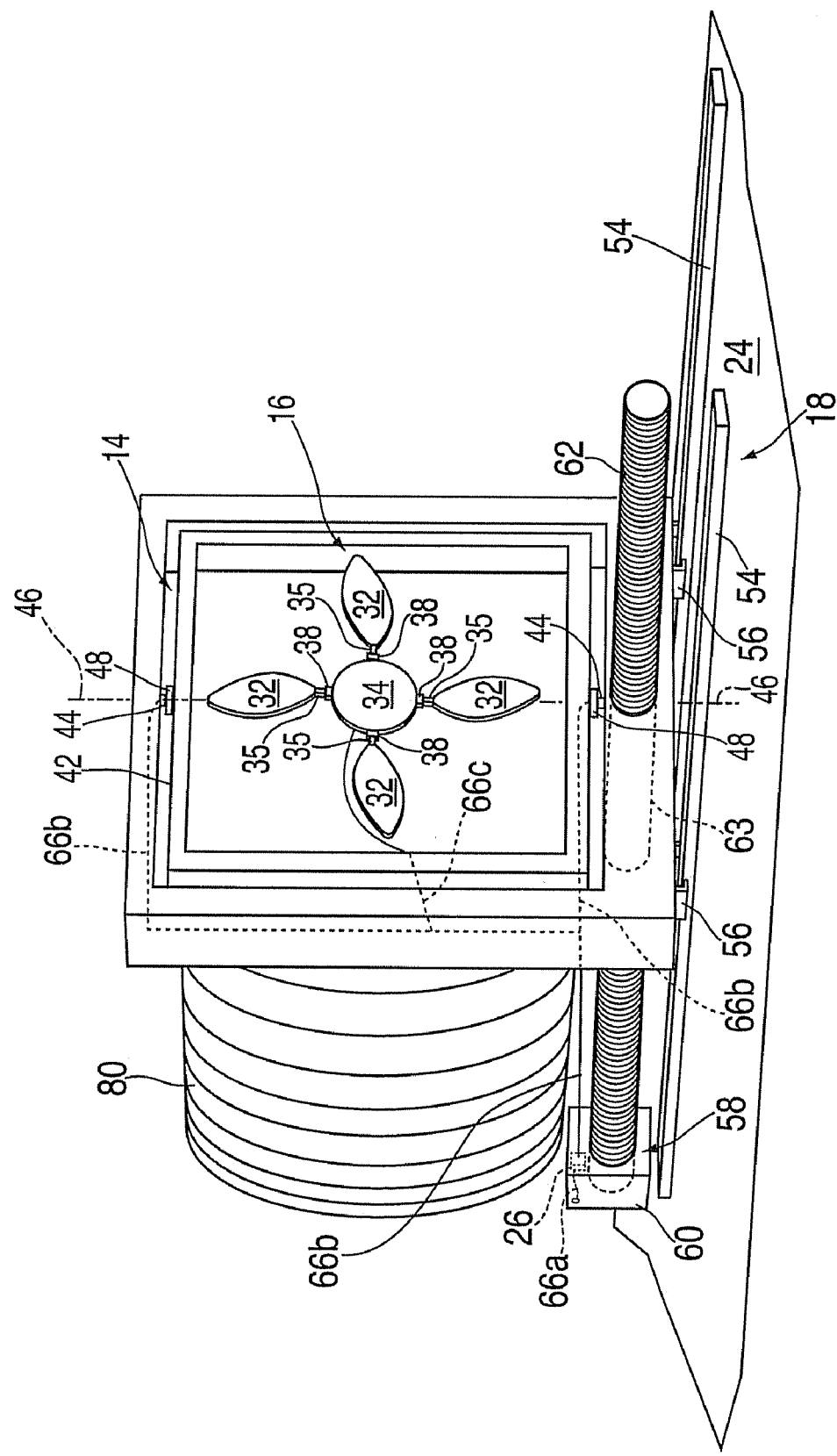
FIG. 2 is a side perspective view of a partial schematic of the dynamic air moving system.
Figure 3:
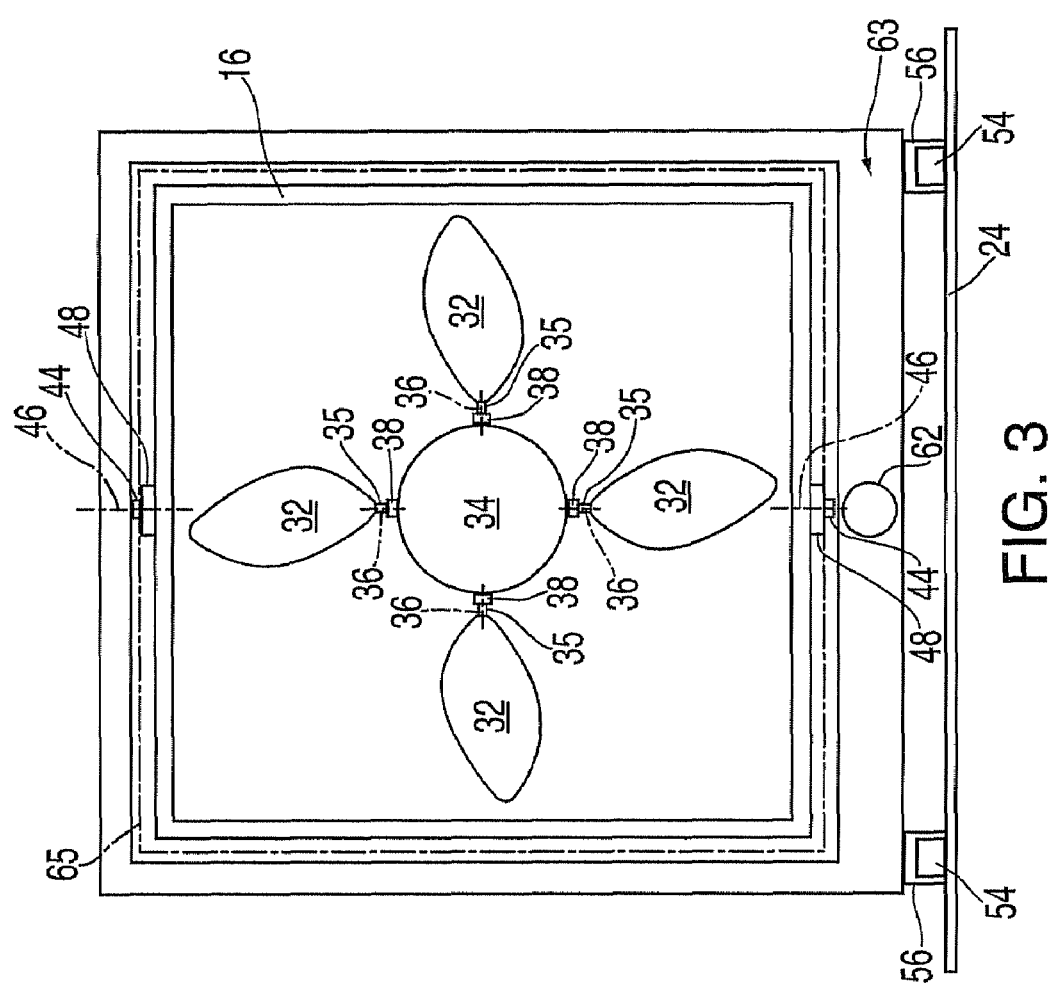
FIG. 3 is a frontal elevation view of a partial schematic of fan, fan housing, and rail system.

Referring to FIGS. 1-3, a dynamic air moving system 10 is illustrated. The system 10 includes at least one fan housing 12, each of which defining a housing cavity 14 receptive to a fan 16. The system 10 also includes a rail system 18, on which the fan housing 12 is disposed. The rail system 18 is disposed within a cooling cavity 20 defined by an electronic enclosure 22, such as a computer, and associated with an enclosure surface 24 adjacent the cooling cavity 20. Further included in the system 10 is a fan controller chip 26, a chip thermal sensor 28 and a drive thermal sensor 30.

With the general components of the system having been briefly introduced, a more detailed description of each will now follow, beginning with the fan 16 and fan housing 12. The fan or fans 16 of the system 10 each include at least one rotatable blade 32. The blades 32 extend from a fan hub 34 via blade axis structures 35, wherein each blade 32 is rotatable 360 degrees around a central fan axis 37, as well as individually rotatable 360 degrees around blade axes 36. The blades 32 are rotated via at least one electric motor 38 (such as a stepper motor) associated with the blade axis structures 35. Pitch of each blade 32 is also individually adjustable.

In an exemplary embodiment, the fan 16 also includes a fan body 42. Extending from the fan body 42 is at least one axis structure 44. The axis structure 44 associates the fan body 42, and thus, the fan 16 as a whole, with the fan housing 12. The fan 16 is positioned within the housing cavity 14, and pivotable 360 degrees about a fan axis 46, independent of fan housing 14 movement. The fan axis 46 runs substantially orthogonally of the enclosure surface 24. The fan 16 is rotated via at least one electric motor 48 (such as a stepper motor) associated with the axis structures 44. Pivoting of the fan 16 is indicated in FIG. 3 by directional arrow 50.

As mentioned above, the fan 16 is disposed within the housing cavity 14 of the fan housing 12. The fan housing 12 is disposed on a rail system 18, and moveable along the rail system 18 in an x-direction 52. The rail system 18 may comprise two rails 54 that run a substantial length of the enclosure surface 24 (or extend from a side of the enclosure 22, along a plane parallel to the surface 24, a substantial length of the enclosure 22). These rails 54 may be configured to interface with grooved guides 56 (see FIG. 3) that extend from the fan housing 12. In an exemplary embodiment, movement of the guides 56, and thus, the fan housing 12 and fan 16, along the rails 54 in the x-direction 52 may be actuated via a threaded lead screw assembly 58 associated with an electric motor 60. The lead screw assembly 58 includes a screw portion 62 that may extend through a threaded cavity (not visible in the Figures because the screw portion 62 is disposed within the cavity) defined by a portion 63 of the fan housing 12. The portion 63 will be located outside of a pivot region defined by dashed lines 65 in FIGS. 2 and 3. This portion 63 may be any portion of the fan housing 12 configured to include a threaded cavity that can accommodate the screw portion 62, as long as the portion is disposed outside of the pivot region. The threaded lead screw assembly 58 is fixed to a surface 64 of the electronic enclosure 22 that is substantially perpendicular to the enclosure surface 24, wherein the surface 64 may be located at any side of the electronic enclosure 22. The electric motor 60 rotates the screw portion 62 in both clockwise and counterclockwise direction. Rotation of the screw portion 62 moves the fan 16 and fan housing 12 in the x-direction 52, toward and away from the surface 64. It should be appreciated that the system 10 may include a linear variable placement transducer instead of the threaded lead screw assembly 58.

Rotation of the screw portion 62 of the threaded lead screw assembly 58 is controlled by the fan controller chip 26. The fan controller chip 26 may be disposed anywhere in the electronic enclosure 22, and also controls rotation of the fan 16 and blade 32. The fan controller chip 26 controls actuation and rotation of the fan 16, and rotation of the blades 32 via electric links 66a-c to the electric motors 38, the electric motors 48, and the electric motor 60 associated with each. For example, the fan controller chip 26 links to the electric motor 60 via link 66a, and controls when and in what direction the screw portion 62 is rotated, depending upon a desired position of the fan 16. Similarly, the fan controller chip 26 links to the electric motors 38 and 48, and controls when and in what direction the blades 32 and fan 16 are rotated respectively.

The fan controller chip 26 determines how to control the electric motors 38, 48, and 60 of the system 10 via information received from the chip thermal sensor 28 and/or the drive thermal sensor 30. The drive thermal sensor 30 detects information pertaining to temperature at and around a disc drive 68 of the electronic enclosure 22. The drive thermal sensor 30 electrically transmits temperature information to the fan controller chip 26 via an electric link 70. Similarly, the chip thermal sensor 28 detects information pertaining to temperature at and around various chips 72a-c of the electronic enclosure 22. These chips may be a central processing unit 72a, a chipset 72b, and a RAM chip 72c. The chip thermal sensor 30 associated with each of these chips 72a-c electrically transmits temperature information to the fan controller chip 26 via an electric links 74a-c (which may be disposed along the sides of the electronic enclosure 22). This information pertaining to drive 68 and chip 72a-c temperature includes drive and chip position, and allows the fan controller chip 26 to determine which component regions (i.e. regions around the chips 72a-c and disk drive 68) are in need of cooling. The fan controller chip 26 uses this information to control/direct the electric motors 38, 48, and 60 to position the fan blades 32 and fan 16 in a manner that will cool the regions in need of cooling. For example, if the CPU chip 72a is in need of cooling and located in a relative top, right, forward region 76 of the cooling cavity 20, as shown in FIG. 1, the fan controller chip 26 may direct the electric motors 38 to position the blades 32 to direct cooling air upwards, direct the electric motors 48 to pivot the fan 16 to the right, and direct the electric motor 60 to move the fan 16 along the rail system 18 towards the relative front of the cavity 20. Positioning the fan 16 in this manner allows cooling air to be directed to the relative top, right, forward region 76 of the cavity 20, cooling the CPU chip 72a. While this example demonstrates cooling air being directed to the region 76 of the cooling cavity 20, it should be appreciated that moveability/pivotability of the fan 16 allows cooling air to be directed to any region of the cavity 20 that includes a chip 72a-c or drive 68 in need of cooling.

Referring to FIGS. 1 and 2, it should be appreciated that an exemplary embodiment of the system 10 may also include an extendable exhaust tube 80 that associates the fan 16 with an exhaust port 82 defined by an exhaust surface 84 (which may also be the surface 64 substantially perpendicular to the enclosure surface 24). The exhaust tube 80 may be configured and constructed to extend and move within the cooling cavity 20 with the fan 16. Extendibility and flexibility of the tube 80 allows the fan 16 to transport exhaust to the exhaust post 82 (and out of the electronic enclosure 22), regardless of fan position. In addition, the exhaust tube 80 may function to facilitate association between the fan controller chip 26 and the electric motors 38 and 48 of the fan 16 by allowing the links 66b-c (which may be at least one wire) to be positioned within or upon the body of the tube 80.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A dynamic air moving system comprising:
    a rail system disposed in a cooling cavity of an electronic enclosure, said rail system being associated with an enclosure surface adjacent said cooling cavity;
    at least one fan housing moveably disposed on said rail system, said fan being actuatable along said rail system in an x-direction;
    a fan disposed in a fan cavity defined by each of said at least one fan housings, said fan being pivotable within said fan cavity about an axis running substantially orthogonally to said enclosure surface;
    at least one axis structure associating said fan with each of said at least one fan housing;
    at least one blade included with said fan, said at least one blade being rotatable about a central fan axis and individually rotatable about at least one blade axes;
    a fan controller chip disposed in said electronic enclosure, said fan controller chip controlling actuation of said at least one fan housing, individual rotation of said at least one blade, and rotation of said fan;
    a chip thermal sensor disposed on at least one chip located in said electronic enclosure, said thermal sensor being linked to said fan controller chip; and
    a drive thermal sensor disposed on at least one disk drive associated with said electronic enclosure, said drive thermal sensor being linked to said fan controller chip.

2. A system according to claim 1, wherein said at least one chip is a central processing unit, a chipset, and a RAM chip, each of said central processing unit, said chipset, and said RAM chip including said chip thermal sensor.

3. A system according to claim 1, wherein said at least one fan housing is actuatable via a threaded screw assembly associated with an electric motor, said electric motor being linked to and controlled by said fan controller chip.

4. A system according to claim 1, wherein said fan is rotatable via at least one electric motor associated with said at least one axis structure, said at least electric motor being linked to and controlled by said fan controller chip.

5. A system according to claim 1, wherein said at least one rotatable blade is rotatable via at least one electric motor associated with said fan, said at least one electric motor being linked to and controlled by said fan controller chip.

6. A system according to claim 1, further including an extendable exhaust tube that associates said at least one fan housing with an exhaust port defined by an exhaust surface of said electronic enclosure.

7. A system according to claim 1 wherein each of said at least one blades is pitch adjustable.

* * * * *